United States Patent [19]

Keller et al.

[11] 4,417,162

[45] Nov. 22, 1983

[54] TRI-STATE LOGIC BUFFER CIRCUIT

[75] Inventors: Jack K. Keller, Macungie; Gilbert L. Mowery, Jr., Allentown, both of Pa.

[73] Assignee: Bell Telephone Laboratories, Incorporated, Murray Hill, N.J.

[21] Appl. No.: 300,590

[22] Filed: Sep. 9, 1981

Related U.S. Application Data

[63] Continuation-in-part of Ser. No. 2,741, Jan. 11, 1979, abandoned.

[51] Int. Cl.³ .............. H03K 19/003; H03K 19/094; H03K 19/173; H03K 19/20
[52] U.S. Cl. ................................. 307/473; 307/450
[58] Field of Search ............. 307/448, 450, 473, 475, 307/270

[56] References Cited

U.S. PATENT DOCUMENTS

| | | | |
|---|---|---|---|
| 3,937,983 | 2/1976 | Reed | 307/482 |
| 3,938,108 | 2/1976 | Salsbury et al. | 307/475 X |
| 3,980,898 | 9/1976 | Priel | 307/473 |
| 4,029,971 | 6/1977 | Pryor | 307/473 |
| 4,037,114 | 7/1977 | Stewart et al. | 307/473 |
| 4,042,839 | 8/1977 | Araki | 307/450 |
| 4,096,398 | 6/1978 | Khaitan | 307/475 |
| 4,101,788 | 7/1978 | Baker | 307/450 |
| 4,135,102 | 1/1979 | Green et al. | 307/450 |
| 4,161,040 | 7/1979 | Satoh | 307/475 X |

OTHER PUBLICATIONS

Homan, "FET Depletion Load Push-Pull Logical Circuit"; *IBM Tech. Discl. Bull.*, vol. 18, No. 3, pp. 910–911, 8/1975.

Love, "In-Phase Weak-Signal Input Circuit"; *IBM Tech. Discl. Bull.*, vol. 19, No. 12, pp. 4673, 5/1977.

*Primary Examiner*—Larry N. Anagnos
*Attorney, Agent, or Firm*—David I. Caplan

[57] ABSTRACT

A first MOS (metal-oxide-semiconductor) NOR-gate device feeding a second MOS NOR-gate device feeding an MOS output load device is arranged to yield a three output level buffer circuit, that is, whose output to a common data bus line can be "high" ("1"), "low" ("0"), or of very high impedance ("floating"). Each NOR-gate contains a low $\beta$ ("load") depletion mode type of MOS transistor and a high $\beta$ ("driver") enhancement mode type of MOS; the output load device contains an output driver enhancement mode type of MOS transistor and an output load MOS transistor having a threshold intermediate that of the depletion mode and enhancement mode type of MOS transistor. In this manner, only a single voltage source $V_{DD}$, or typically about +5 volts in N-MOS integrated circuit technology is required to power the buffer circuit completely.

9 Claims, 4 Drawing Figures

TRI-STATE LOGIC BUFFER CIRCUIT

CROSS REFERENCE TO RELATED APPLICATION

This application is a continuation-in-part of our co-pending application, Ser. No. 002,741, filed Jan. 11, 1979, now abandoned.

TECHNICAL FIELD

This invention relates to semiconductor apparatus and more particularly to semiconductor logic circuits characterized by three logic levels.

BACKGROUND OF THE INVENTION

As known in the art, in many logic circuit applications, including those which are not controlled by a master timing clock ("asynchronous"), it is desirable to operate with three-state ("tri-state") capability. More specifically, it is desirable to have a number of separate buffer circuits each connecting a different one of a number of separate binary digital local input signal sources to a common data bus line. Each such buffer circuit has an output terminal connected to the common bus line, in order to deliver the corresponding digital local input signal to this common bus line if, and only if, no other signal is then actively present on that line from other sources, but otherwise to float (i.e., otherwise to present a very high impedance to the common data bus line).

For purpose of illustrating these concepts and with reference to FIG. 1, a binary digital "1" or "0" signal ("high" or "low" voltage) may or may not actively be present from other sources (not shown) on a common data bus line 11 at a given moment. By a signal "actively" present from other sources on the common data bus line is meant a low impedance driven signal from another source. In the absence of any such active signal from other sources, the common data bus line 11 is electrically "floating," that is to say, has a very high impedance to ground. Only if this common data bus line 11 is thus "floating," then a buffer circuit 20 is enabled by a control signal from the source 13 to allow passage of a local binary digital input signal 14 to an output terminal 12 on the bus line 11; but, if there is indeed a signal already actively present on the common data bus line 11, then the control signal source 13 prevents the buffer circuit 20 from passing any local signal 14 to the common data bus line 11 and causes this buffer circuit to present a very high impedance to the bus line, that is, the output of the buffer circuit 20 at terminal 12 is electrically in the "floating" state. This terminal 12 thus serves as a local signal output terminal of the buffer circuit 20. Since the local input signal 14 itself can be a "high" voltage (digital "1") or a "low" voltage (digital "0"), accordingly there are three possible local outputs or "states" ("1", "0", "float") of the buffer circuit 20 at its output terminal 12, depending upon the states of both the local signal input 14 and the control signal delivered by the source 13, all in accordance with the following:

| Local Signal 14 | Control Signal 13 | Non-Inverting Buffer Circuit Output |
|---|---|---|
| 0 | 1 | float |
| 1 | 1 | float |
| 0 | 0 | 0 |
| 1 | 0 | 1 |

In the prior art, such a tri-state buffer circuit has been proposed in the form of an MOS integrated circuit, in N-MOS technology for example (FIG. 2). Basically such a circuit includes a pair of MOS NOR-gates (formed by transistors $Q_3$, $Q_4$, $Q_4'$; $Q_5$, $Q_6$, $Q_6'$) feeding an MOS output load device including an output "driver" transistor $Q_2$ and an output load transistor $Q_1$. It should be understood that each of the transistors $Q_4$ and $Q_6$ is a high transconductance transistor serving as a driver and is substantially identical to its corresponding parallel connected twin transistor $Q_4'$ and $Q_6'$, respectively. The transistors $Q_3$ and $Q_5$ are relatively low transconductance transistors serving as load elements. The gate electrode of each of the transistors $Q_3$ and $Q_5$ is connected to the drain terminal of the respective transistor when using such enhancement mode N-MOS devices. All transistors in the circuit shown in FIG. 2 are enhancement mode transistors, with the same threshold of typically about 1.2 volts. However, such a circuit requires both a relatively high voltage supply ($V_{GG} = +12$ volt) in addition to a relatively low voltage supply ($V_{DD} = +5$ volt) for reliable operation, because the existence of a non-vanishing threshold voltage of the output load transistor $Q_1$ results in a "back-gate bias" of $Q_1$ itself when it is in the "on" condition. This "back-gate bias" arises because the voltage at the source of $Q_1$ becomes higher than the voltage of its substrate (ground), thereby increasing the required gate electrode voltage for turning this transistor "on", i.e., thereby increasing its threshold voltage during operation. This increase in threshold voltage during operation ("back-gate bias effect") prevents $Q_1$ from being turned "on" properly unless the drains and gates of both the previous stages' NOR-gate load transistors ($Q_5$, $Q_3$) are connected to a relatively high voltage supply, typically +12 volt.

For example, when the output drive transistor $Q_2$ is "off" and the output load transistor $Q_1$ is "on," then the potential of the output terminal 12 tends toward $V_{DD}$, thereby undesirably tending to shut "off" this output load transistor $Q_1$ by virtue of the back-gate bias effect on its threshold, unless the voltage being applied to its gate electrode be increased above $V_{DD}$ by a higher drain voltage supply ($V_{GG} = 12$ volts) to $Q_5$. For example, if the threshold of $Q_1$ is 1.2 volts under the condition of zero "back-gate bias," i.e., when the source of $Q_1$ is at the same ("ground") potential as that of the semiconductor substrate, then this threshold will rise to as much as about 3 volts when the source of $Q_1$ is at a potential of 4 or 5 volts, i.e., when $Q_1$ itself is "on"; accordingly, since the load transistor $Q_5$, which is then also "on", suffers from this same type of back-gate bias threshold effect, therefore the source potential of $Q_5$ will not rise to the required voltage of about 3 volts necessary to keep $Q_1$ "on" unless the drain of $Q_5$ be supplied considerably more than 5 volts or unless $Q_5$ be a depletion mode N-MOS transistor with its gate electrode connected to its source. But even if $Q_5$ is such a depletion mode device, thereby supplying 5 volts to the gate of $Q_1$; nevertheless, when $Q_1$ is "on," the source of the output load transistor $Q_1$ will not be able to rise to much above 2 (=5−3) volts, instead of a desired 3 or more volts, unless the supply to the drain of this output load transistor $Q_1$ and to the drain (and gate) of $Q_5$ be raised, to say 12 volts. The use of such a high voltage drain supply requires the use of an additional voltage supply (i.e., +12 volts as well as +5 volts), and also results in the problem of undesirably large amounts of power being drawn during operation. Accordingly, it would be desirable to have a tri-state MOS buffer circuit which does not suffer from this problem.

SUMMARY OF THE INVENTION

A tri-state buffer circuit (FIGS. 3 and 4) in MOS technology is in the form of a pair of NOR-gates feeding an output MOS load device ($M_1$, $M_2$), said load device including a first MOS load transistor ($M_1$) whose high current (source-drain) path is connected in series with that of an output MOS driver transistor ($M_2$), each NOR-gate including a relatively low $\beta$ MOS load transistor ($M_3$; $M_5$) in series with a separate pair of relatively high $\beta$ MOS driver transistors connected in parallel ($M_4$, $M_4'$; $M_6$, $M_6'$), characterized in that the threshold voltage of the output load transistor ($M_1$) corresponds to slightly enhancement mode transistor operation, that is, intermediate between the threshold voltage of the NOR-gate load transistors ($M_3$, $M_5$) in the NOR-gates and the threshold voltage of the driver transistors ($M_2$, $M_4$, $M_4'$, $M_6$, $M_6'$) in both the output device and the NOR-gates, the thresholds of the NOR-gate load transistors ($M_3$, $M_5$) corresponding to depletion mode transistor operation and the thresholds of the driver transistors ($M_2$, $M_4$, $M_4'$, $M_6$, $M_6'$) corresponding to regular enhancement mode operation. By "slightly enhancement" is meant a threshold of the same polarity as, but of lower magnitude than, that of a regular (ordinary) enhancement mode transistor. Thus, three different threshold voltages (all measured under zero back-gate bias) are present in the circuit. These at least three different threshold voltages result in the circuit from the presence of at least three correspondingly different doping levels in the respective channel (gate) regions of the respective transistors. In this way, a single relatively low voltage power supply, typically about +5 volts (in N-MOS technology) or less, can be used for operating the buffer circuit with a satisfactory output level.

BRIEF DESCRIPTION OF THE DRAWING

This invention together with its features, advantages, and objects can be better understood from the following detailed description when read in conjunction with the drawing in which.

Figure 1:
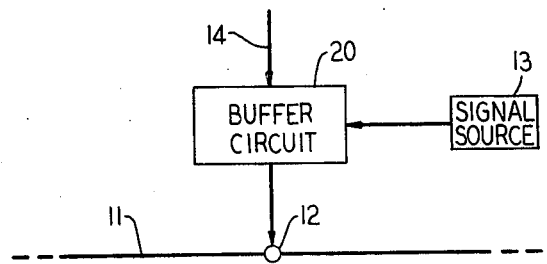
FIG. 1 is an electrical block diagram of a tristate logic buffer circuit, useful for describing its operation in the prior art.
Figure 2:
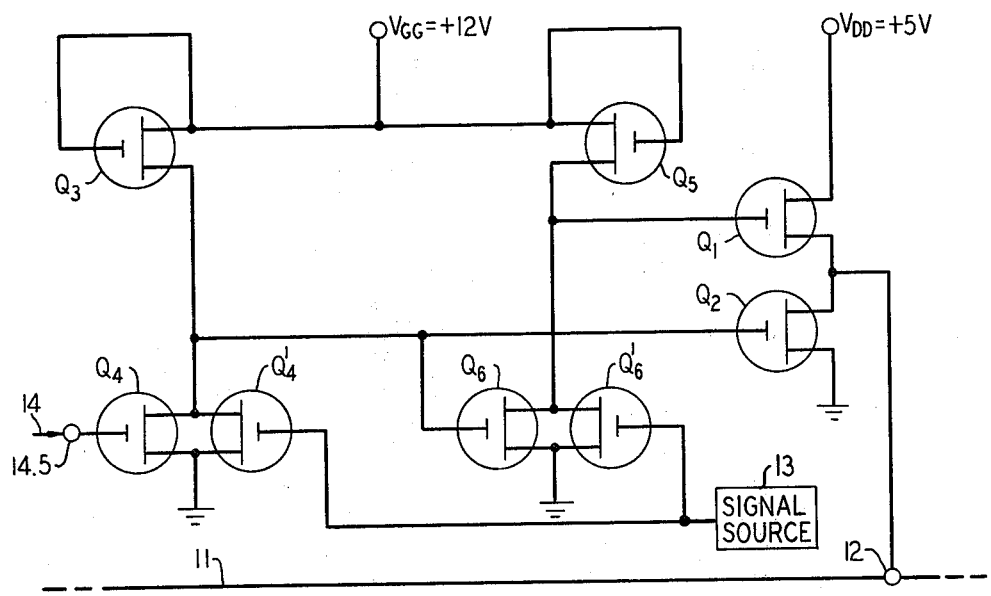
FIG. 2 is a circuit diagram of a prior art tristate buffer circuit in MOS technology.
Figure 3:
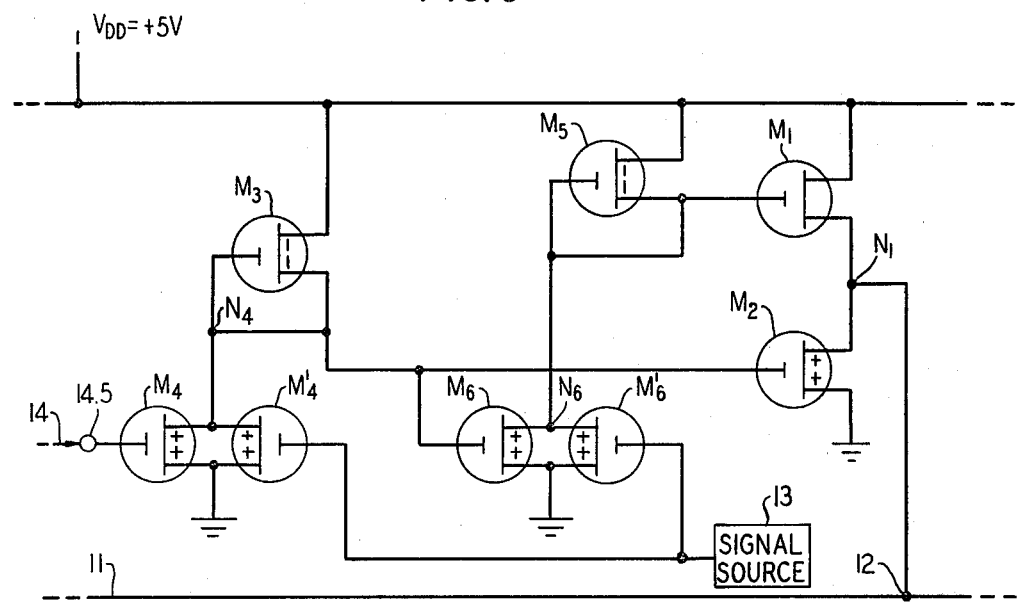
FIG. 3 is a circuit diagram of an MOS tri-state non-inverting buffer circuit in accordance with a specific embodiment of the invention.
Figure 4:
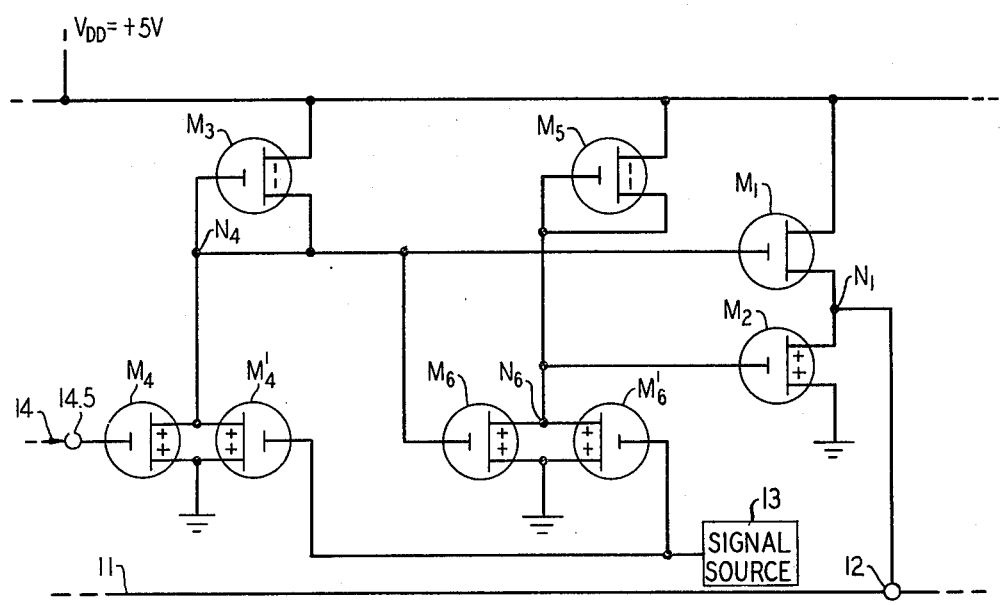
FIG. 4 is a circuit diagram of an MOS tri-state inverting buffer circuit in accordance with another specific embodiment of the invention.

Transistors in FIGS. 3 and 4 (N-MOS technology) that have channel regions doped with acceptor impurities (regular enhancement mode) are so indicated by the "plus" signs along the corresponding transistor channels in the drawing; on the other hand, transistors that have channel regions doped with donor impurities (depletion mode) are so indicated by "minus" signs along the corresponding transistor channels in the drawing; and transistors with channels that are slightly enhancement mode are so indicated by the lack of either such "plus" or "minus" signs along the corresponding channels. By "slightly enhancement" is meant either that the channel is not subjected to impurity introduction beyond those impurities originally present in the semiconductor wafer or that the channel is doped only lightly as compared with the doping of the channel of an enhancement mode transistor. Thus the threshold voltage of a "slightly enhancement" channel is of the same polarity as that of the regular enhancement mode channel but is of reduced magnitude as compared therewith.

DETAILED DESCRIPTION

Only for the sake of definiteness, the buffer circuit illustrated in FIG. 3 is assumed to be in N-MOS integrated circuit technology. As shown in FIG. 3, a common data bus line segment 11 is connected to the gate electrodes of both the transistors $M_4'$ and $M_6'$. A local input signal terminal 14.5 is connected to the gate electrode of transistor $M_4$ whose high current (source-drain) path is in parallel with that of $M_4'$. The gate electrode of transistor $M_6$ is connected to the common drain node $N_4$ of transistors $M_4$ and $M_4'$. This common drain node $N_4$ is connected through the high current (source-drain) path of transistor $M_3$ to a voltage source $V_{DD}$ of typically +5 volts. Similarly, the common drain node $N_6$ of transistors $M_6$ and $M_6'$ is connected through the high current path of transistor $M_5$ to the voltage source $V_{DD}$. The gate electrode of each of the transistors $M_3$ and $M_5$ is connected to the respective source terminal of each of these transistors. Finally, the gate electrode of transistor $M_1$ is connected to the node $N_6$; the gate electrode of transistor $M_2$ is connected to the node $N_4$; and the high-current paths of $M_1$ and $M_2$ are mutually connected in series, the resulting common node $N_1$ between $M_1$ and $M_2$ being connected to the output terminal 12 on the common data bus line 11. The transistors $M_1$ and $M_2$ form a "load device" with input modes formed by the gate electrodes of these transistors. The transistor $M_1$ serves as a "load" during operation and the transistor $M_2$ serves as the "driver" of said "load." All transistors ($M_1$, $M_2$, $M_3$, $M_4$, $M_4'$, $M_5$, $M_6$, $M_6'$) are integrated in a single semiconductive silicon body (not shown) in accordance with MOS integrated circuit technology. The sources of $M_4$, $M_4'$, $M_6$, and $M_6'$ are all connected to "ground," i.e., the body ("substrate"), so that they all operate under zero "back-gate" bias voltage.

Typical approximate values of the parameters of transconductance $\beta$ and threshold voltage $V_T$ (under zero back-gate bias) are:

| Transistor | $\beta$ ($10^{-6}$ amps/volt$^2$) | $V_T$ (volts) |
|---|---|---|
| $M_1$ (slightly enhancement) | 400 | 0.8 |
| $M_2$ (regular enhancement) | 2200 | 1.3 |
| $M_3$ (depletion) | 50 | −2.3 |
| $M_4$ (regular enhancement) | 600 | 1.3 |
| $M_5$ (depletion) | 50 | −2.3 |
| $M_6$ (regular enhancement) | 600 | 1.3 |

All threshold voltages have margins of about ±0.3 volts, consistent with the thresholds of the regular enhancement transistors being greater than those of the slightly enhancement transistors.

As seen from the above listing of parameters, the transconductance β of the output driver transistor $M_2$ is higher than that of the output load transistor $M_1$, but this may not be essential. The respective values of transconductance β are achieved by suitable choices of the ratio of channel width to length, as known in the art; the respective values of threshold voltage $V_T$ are obtained by suitable impurity doping of the semiconductor gate regions of the respective channels, as by ion implantation techniques known in the art. This channel impurity doping can, for example, be achieved by using known masking techniques with apertures over those gate regions where the impurity is desired to be implanted during an ion-implantation step, so that only those transistors with channels underlying unmasked (apertured) gate regions will have their thresholds altered by the implantation step.

In order to understand the operation of the circuit shown in FIG. 3, the first case to be considered is the case where the control signal 13 is "high" in voltage level (digital "1") due to the presence of a "1" or a "0" signal level on the common data bus line 11 actively present from another local signal source. In this case, this control signal puts both the high β transistors $M_4'$ and $M_6'$ into their "on" conditions, thereby bringing both the nodes $N_4$ and $N_6$ to ground potential, i.e., "low" potential, thus putting both the transistors $M_1$ and $M_2$ into their "off" conditions, regardless of the conditions of the low β transistors $M_3$ and $M_5$ in series therewith, and regardless of the conditions of the transistors $M_4$ and $M_6$ in parallel therewith. Accordingly, the node $N_1$ then electrically floats, regardless of the local input signal 14, i.e., regardless of the "on" vs. "off" conditions of $M_4$ and $M_6$. Thus, a control signal 13 which is "high" prevents the passage of local signal 14 to the common data bus line 11, as desired.

Turning to the case where the control signal 13 is "low", i.e., all other local signal sources (buffers) connected to line 11 are "floating" (outputs are in high impedance state); in this case both of the transistors $M_4'$ and $M_6'$ are thus "off." Accordingly the voltages at nodes $N_4$ and $N_6$, and hence the voltage on the gate electrodes of $M_1$ and $M_2$, respectively, depend upon the "on" vs. "off" conditions of transistors $M_4$ and $M_6$. If the local input signal 14 is then "high" (digital "1"), then the high β transistor $M_4$ is "on", thereby bringing the potential of node $N_4$ down to substantially ground ("low") potential and hence putting both the transistors $M_2$ and $M_6$ into their respective "off" conditions. On the other hand, the potential of node $N_6$ will then be controlled by the condition of transistor $M_5$, since then both transistors $M_6$ and $M_6'$ are "off"; at this time the potential of this node $N_6$ will thus be about +5 volts since the transistor $M_5$ is then "on" because its threshold voltage is still negative despite an increase in its threshold caused by its resulting back-gate bias. Accordingly, the node $N_6$ being at +5 volts, the output load transistor $M_1$ will be "on," and very strongly so, because its threshold is only a fraction of a volt under zero back-gate bias and is less than +2 volts (and hence much less than +5 volts) under a back-gate bias of as much as 4 or 5 volts. Thus, the potential of $N_1$ and hence of the source of the output load transistor $M_1$, and hence also the output voltage at the output terminal 12, will then rise to at least about $(5-2)=3$ volts. On the other hand, with a 1.3 volt (regular enhancement) threshold for this output load transistor under zero back-gate bias, this output voltage would be only about 2 volts or less.

Accordingly, the advantage of using a relatively low (i.e., lower than that of $M_2$) but positive threshold voltage for the output load transistor $M_1$ is apparent: it provides a wider margin of distinction in output voltage level between an output "0" (=0 volts) vs. an output "1" (=3 volts or more).

In the case where the control signal 13 is still "low" (no signals on the line 11 from other sources) and the local signal 14 is also "low" (digital "0"); then, since both transistors $M_4$ and $M_4'$ are therefore "off," the node $N_4$ will be at a voltage about equal to $V_{DD}=5$ volts. Accordingly, both the NOR-gate driver transistor $M_6$ and the output driver $M_2$ will be "on"; so that in particular the node $N_6$ will be substantially at ground potential, thereby keeping the output load transistor $M_1$ in its "off" condition, while the output driver transistor $M_2$ will then be "on." Thus, the output terminal 12 will be at ground ("low") potential, that is, an output digital "0" results in response to a local input signal 14 of digital "0," as desired.

Turning to the tri-state MOS buffer circuit shown in FIG. 4, this buffer circuit is obtained by modifying the circuit of FIG. 3 to connect the node $N_4$ to the gate electrode of transistor $M_1$ instead of $M_2$ and the node $N_6$ to the gate electrode of $M_2$ instead of $M_1$. In this way, when the control signal does not disable the buffer circuits, a local input signal at input terminal 14.5 of digital "1" results in an (inverted) output voltage at the output terminal 12 of digital "0" (instead of digital "1" as in the buffer circuit of FIG. 3), and a local input of digital "0" results in an output of digital "1." Thus, the buffer circuit of FIG. 4 inverts the local input signal so long as the control signal source 13 does not put out its disabling signal, otherwise (when the control signal is disabling) the output of this buffer circuit is electrically "floating" just as in the case of the circuit shown in FIG. 3.

It should be noted that the arrangement of transistors $M_3$, $M_4$ and $M_4'$ constitutes a NOR-gate, as does the arrangement of transistors $M_5$, $M_6$, and $M_6'$. Specifically, the node $N_4$ is "high" in voltage if, and only if, both transistors $M_4$ and $M_4'$ are "off," that is, if, and only if, neither the local input signal 14 nor the control signal from the control signal source 13 is "high." If either (or both) such signal is "high," then the corresponding one (ones) of the transistors $M_4$ and $M_4'$ is then "on," thereby connecting the node $N_4$ to ground ("low") potential through a high β (high conductance) path. Conversely, the only way that the node $N_4$ can be "high" (digital "1") is by having both transistors $M_4$ and $M_4'$ in the "off" condition, that is, by having the voltage of both the input signals 13 and 14 "low" (digital "0"). Thus, the output at node $N_4$ of the arrangement $M_3$, $M_4$, and $M_4'$ corresponds to that of a NOR-gate; and similarly for the arrangement $M_5$, $M_6$, $M_6'$.

As noted above, it is advantageous that the threshold voltage of the output load transistor $M_1$ be lower than those of the output driver transistor $M_2$ and the NOR-gate driver transistors ($M_4$, $M_4$, $M_6$, $M_6'$), in order to promote wider margin of output level distinction between the "on" and "off" conditions of $M_1$. On the other hand, it is also advantageous that the threshold voltages of the load transistors $M_3$ and $M_5$ in the NOR-gates be still lower than that of the load transistor $M_1$ in the output, in order to avoid undesirable threshold drops across these NOR-gate loads even under operating conditions of back-gate bias which would otherwise prevent proper turn-on of the output load transistor $M_1$.

Thus, the threshold voltage of the output load transistor $M_1$ should be intermediate between that of the NOR-gate load transistors ($M_5$ and $M_3$) and that of the NOR-gate drive transistors ($M_4$, $M_4'$, $M_6$, $M_6'$).

Although this invention has been described in detail in terms of specific illustrations, various modifications can be made without departing from the scope of the invention. For example, the output load transistor can have non-vanishing impurity doping (as by ion implantation) in its gate (channel) region in conjunction with a suitable semiconductor wafer substrate doping level, in order to obtain the desired threshold voltage. Also regarding technology, instead of N-MOS transistors, P-MOS (P channel) transistors can be used by changing the polarity of the voltage supply and correspondingly changing the threshold voltages of the various transistors by suitable impurity doping. Finally, $V_{DD}$ can be made less than 5 volts, down to about 2 or 3 volts or even less, accompanied by suitable modification in the zero back-gate bias threshold voltages, particularly those of the enhancement mode channels. The semiconductor body substrate can alternatively be held at negative potential, typically about $-3$ volts, so that the thresholds of the transistors, particularly the loads $M_1$, $M_3$, $M_5$, will not change their effective threshold voltages so much during signal changes which modify the source potential of these load transistors.

What is claimed is:

1. A tri-state MOS buffer circuit comprising first and second NOR-gates, respectively, responsive to input logic signals, and having first and second output nodes, respectively, connected to first and second input nodes, respectively, of an output MOS load device ($M_1$, $M_2$); said load device including a first MOS enhancement transistor ($M_1$), having a relatively low threshold voltage under zero back-gate bias, whose high current path is connected in series with that of an output MOS enhancement mode driver transistor ($M_2$), having a relatively high threshold voltage under zero back-gate bias, and wherein the series connection of said output MOS transistors is used to effect an output node connection; each NOR-gate including a relatively low $\beta$ MOS depletion mode load transistor ($M_3$; $M_5$) each separately connected in series with a separate pair of relatively high $\beta$ MOS enhancement mode driver transistors ($M_4$, $M_4'$; $M_6$, $M_6'$) connected in parallel with each other.

2. An MOS tri-state buffer circuit comprising:
 (a) a first MOS NOR-gate having a first parallel-connected pair of high $\beta$ enhancement mode MOS transistors, each having a relatively high threshold voltage under zero back-gate bias, whose source-drain paths are both connected in series with the source-drain path of a first low $\beta$ depletion mode MOS transistor;
 (b) a second MOS NOR-gate having a second parallel-connected pair of high $\beta$ enhancement mode MOS transistors, each having a relatively high threshold voltage under zero back-gate bias, whose source-drain paths are both connected in series with the source-drain path of a second low $\beta$ depletion mode MOS transistor;
 (c) a load device comprising a first separate enhancement mode MOS transistor, having a relatively low threshold voltage under zero back-gate bias, and a second separate enhancement mode MOS transistor of high $\beta$, having a relatively high threshold voltage under zero back-gate bias, the source-drain path of the second separate enhancement mode MOS transistor being connected in series with the source-drain path of the first separate enhancement mode MOS transistor;
 (d) means for connecting an output of the first NOR-gate to an input node of the second NOR-gate and to an input node of the load device;
 (e) means for connecting an output of the second NOR-gate to another input node of the load device;
 (f) means for connecting a high current terminal of each of the high $\beta$ transistors in the first and the second NOR-gates and a high current terminal of the second separate enhancement mode transistor in the load device to a first common terminal; and
 (g) means for connecting a high current terminal of each of the low $\beta$ transistors in the first and the second NOR-gates and a high current terminal of the first separate enhancement mode transistor in the load device to another common terminal ($V_{DD}$).

3. Semiconductor apparatus including a tri-state buffer circuit comprising:
 (a) a first MOS NOR-gate which includes a first pair of relatively high transconductance enhancement mode MOS field effect NOR-gate driver transistors whose source-drain paths are connected in parallel between ground and a first NOR-gate output node to which is conductively coupled a high current terminal of a first, relatively low transconductance MOS field effect NOR-gate depletion mode load transistor of said first NOR-gate;
 (b) a second MOS NOR-gate which includes a second pair of relatively high transconductance enhancement mode MOS field effect NOR-gate driver transistors whose source-drain paths are connected in parallel between said ground and a second NOR-gate output node to which is conductively coupled a high current terminal of a second, relatively low transconductance MOS field effect NOR-gate depletion mode load transistor of said second NOR-gate;
 (c) an output load MOS field effect transistor whose gate electrode is conductively coupled to the said first NOR-gate output node;
 (d) an output driver enhancement mode MOS field effect transistor one of whose two high current carrying terminals is conductively coupled to one of the high current carrying terminals of the output load transistor and to an output terminal, and whose gate electrode is conductively coupled to said second NOR-gate output node;
  the threshold voltage, as measured under zero back-gate bias, of the output load transistor corresponding to enhancement and being intermediate between those of both the output driver transistor and the high transconductance transistors of the first and second NOR-gates and those of both the first and second NOR-gate load transistors, respectively;
 (e) electrically conductive means for coupling another high current carrying terminal of both the first and second NOR-gate load transistors and of the output load transistor to a single power supply terminal;
 (f) electrically conductive means for coupling the gate electrode of each of the first and second NOR-gate load transistors to a high current carrying terminal of each of the said first and second NOR-gate load transistors, respectively;

(g) electrically conductive means for coupling the gate electrode of one of the high transconductance NOR-gate driver transistors of each of the first and second pairs to a common terminal for application thereto of a control signal; and (h) electrically conductive means for connecting the other high current carrying terminal of the output driver transistor to said ground.

4. A semiconductor tri-state logic buffer circuit (FIG. 3) in N-MOS technology comprising:

(a) a first MOS transistor ($M_1$) whose source is connected to an output terminal (12) of the buffer circuit;

(b) a second MOS transistor ($M_2$) whose drain is connected to the source of the first transistor ($M_1$);

(c) a third MOS transistor ($M_3$) whose source is connected to its gate electrode and to the gate electrode of the second transistor ($M_2$);

(d) a fourth MOS transistor ($M_4$) whose gate electrode is connected to an input terminal (14.5) of the buffer circuit (FIG. 3) and whose drain is connected to the source of the third transistor ($M_3$);

(e) a fifth MOS transistor ($M_5$) whose source is connected to its gate electrode and to the gate electrode of the first transistor ($M_1$);

(f) a sixth MOS transistor ($M_6$) whose gate electrode is connected to the gate electrode of the second transistor ($M_2$) and whose drain is connected to the source of the fifth transistor ($M_5$);

(g) a seventh MOS transistor ($M_4'$) whose source-drain path is connected in parallel with the source-drain path of the fourth transistor and whose gate electrode is connected to a control signal source (13);

(h) an eighth MOS transistor ($M_6'$) whose source-drain path is connected in parallel with the source-drain path of the sixth transistor ($M_6$) and whose gate electrode is connected to said control signal source;

the second, fourth, and sixth transistors ($M_2$, $M_4$, and $M_6$) having a common and substantially positive zero back-gate bias threshold voltage, the third and fifth transistors ($M_3$ and $M_5$) having a common and substantially negative zero back-gate bias threshold voltage, the first transistor ($M_1$) having a zero back-gate bias threshold voltage which is positive and intermediate the zero back-gate bias threshold voltages of the second and third transistors ($M_2$ and $M_3$);

the drains of the first, third, and fifth transistors ($M_1$, $M_3$, and $M_5$) being connected to a common voltage supply terminal ($V_{DD}$);

the sources of the second, fourth, and sixth transistors ($M_2$, $M_4$, and $M_6$) being connected to ground; and the threshold voltages of the seventh and eighth transistors ($M_4'$ and $M_6'$) being substantially equal to the threshold voltage of the fourth transistor ($M_4$).

5. The circuit recited in claim 4 further comprising: a voltage supply of about 5 volts or less connected to the common voltage supply terminal ($V_{DD}$).

6. A semiconductor tri-state logic buffer circuit (FIG. 4) in N-MOS technology comprising:

(a) a first MOS transistor ($M_1$) whose source is connected to an output terminal (12) of the buffer circuit;

(b) a second MOS transistor ($M_2$) whose drain is connected to the source of the first transistor ($M_1$);

(c) a third MOS transistor ($M_3$) whose source is connected to the gate electrode thereof and to the gate electrode of the first transistor ($M_1$);

(d) a fourth MOS transistor ($M_4$) whose gate electrode is connected to an input terminal (14.5) of the buffer circuit (FIG. 4) and whose drain is connected to the source of the third transistor ($M_3$);

(e) a fifth MOS transistor ($M_5$) whose source is connected to the gate electrode thereof and to the gate electrode of the second transistor ($M_2$);

(f) a sixth MOS transistor ($M_6$) whose gate electrode is connected to the gate electrode of the first transistor ($M_1$) and whose drain is connected to the source of the fifth transistor ($M_5$);

(g) a seventh MOS transistor ($M_4'$) whose source-drain path is connected in parallel with the source-drain path of the fourth transistor ($M_4$) and whose gate electrode is connected to a control signal source (13);

(h) an eighth MOS transistor ($M_6'$) whose source-drain path is connected in parallel with the source-drain path of the sixth transistor ($M_6$) and whose gate electrode is connected to said control signal source;

the second, fourth, and sixth transistors ($M_2$, $M_4$, and $M_6$) having a common and substantially positive zero back-gate bias threshold voltage, the third and fifth transistors ($M_3$ and $M_5$) having a common and substantially negative zero back-gate bias voltage, the first transistor ($M_1$) having a zero back-gate bias threshold voltage which is positive and intermediate the zero back-gate bias threshold voltages of the second and third transistors ($M_2$ and $M_3$);

the drains of the first, third, and fifth transistors ($M_1$, $M_3$, and $M_5$) being connected to a common voltage supply terminal ($V_{DD}$);

the sources of the second, fourth, and sixth transistors ($M_2$, $M_4$, and $M_6$) being connected to ground; and the threshold voltages of the seventh and eighth transistors ($M_4'$ and $M_6'$) being substantially equal to the threshold voltage of the fourth transistor ($M_4$).

7. The circuit recited in claim 5 further comprising: a voltage supply of about 5 volts or less connected to the common voltage supply terminal ($V_{DD}$).

8. The circuit of claim 1 further comprising means for connecting the output node of the first NOR-gate to an input node of a driver transistor of the second NOR-gate.

9. The circuit of claim 1 further comprising means for connecting the output node of the second NOR-gate to an input node of a driver transistor of the first NOR-gate.

* * * * *